(12) United States Patent
Blanchette

(10) Patent No.: US 11,515,629 B2
(45) Date of Patent: Nov. 29, 2022

(54) RADIATION TOLERANT ELECTRO-OPTICAL DEVICES FOR COMMUNICATION IN SPACE

(71) Applicant: REFLEX PHOTONICS INC., Kirkland (CA)

(72) Inventor: Guillaume Blanchette, Montreal (CA)

(73) Assignee: REFLEX PHOTONICS INC., Kirkland (CA)

(*) Notice: Subject to any disclaimer, the term of this patent is extended or adjusted under 35 U.S.C. 154(b) by 40 days.

(21) Appl. No.: 17/091,487

(22) Filed: Nov. 6, 2020

(65) Prior Publication Data

US 2021/0336334 A1 Oct. 28, 2021

Related U.S. Application Data

(60) Provisional application No. 63/015,105, filed on Apr. 24, 2020.

(51) Int. Cl.
*H01Q 1/28* (2006.01)
*H04B 10/40* (2013.01)
(Continued)

(52) U.S. Cl.
CPC .......... *H01Q 3/2676* (2013.01); *H01Q 1/288* (2013.01); *H01S 5/18302* (2013.01); *H04B 10/40* (2013.01)

(58) Field of Classification Search
CPC .. H04B 10/11; H04B 10/18; H04B 10/40–60; H04B 10/801; H04B 7/18513;
(Continued)

(56) References Cited

U.S. PATENT DOCUMENTS 6,252,691 B1 * 6/2001 Porzucki .............. H04B 10/801
370/316
6,792,212 B1 * 9/2004 Lloyd ................ H04B 7/18519
701/13
(Continued)

FOREIGN PATENT DOCUMENTS

| JP | H064554 | 1/1994 |
|---|---|---|
| JP | 2000142599 | 5/2000 |

(Continued)

OTHER PUBLICATIONS

Extended European Search Report dated May 20, 2021, in counterpart EP application.
(Continued)

*Primary Examiner* — Jason Crawford
(74) *Attorney, Agent, or Firm* — Norton Rose Fulbright Canada LLP

(57) ABSTRACT

There are described methods and devices for intra-spacecraft communication in space, the electro-optical device having at least one of transmitting capabilities for converting a first electrical signal into a first optical signal and outputting the first optical signal within a spacecraft, and receiving capabilities for receiving a second optical signal within the spacecraft and converting the second optical signal into a second electrical signal, the electro-optical device having at least one integrated circuit dedicated to at least one of the transmitting capabilities and the receiving capabilities, the at least one integrated circuit configured for operating in an analog mode where configuration voltages for the integrated circuit are provided by analog voltage settings unaffected by radiation.

20 Claims, 7 Drawing Sheets

(51) Int. Cl.
*H01Q 3/26* (2006.01)
*H01S 5/183* (2006.01)

(58) Field of Classification Search
CPC . H04B 7/18515; H04B 7/18521; H01Q 1/288
See application file for complete search history.

(56) References Cited

U.S. PATENT DOCUMENTS

| | | | |
|---|---|---|---|
| 7,158,726 B2 * | 1/2007 | Gayrard | H04Q 11/0062 398/79 |
| 9,614,280 B2 | 4/2017 | Shi et al. | |
| 10,177,841 B2 | 1/2019 | Mentovich et al. | |
| 2003/0123879 A1 * | 7/2003 | Gayrard | H04Q 11/0062 398/171 |
| 2012/0128019 A1 | 5/2012 | Chang-Hasnain et al. | |
| 2015/0010034 A1 | 1/2015 | Chang-Hasnain et al. | |
| 2016/0065308 A1 * | 3/2016 | Coleman | H04B 10/1129 398/79 |
| 2016/0334591 A1 * | 11/2016 | Wood | G02B 6/4206 |
| 2019/0007129 A1 * | 1/2019 | Vargas | H04B 7/1858 |
| 2019/0348813 A1 | 11/2019 | Johnson et al. | |
| 2020/0235807 A1 * | 7/2020 | Mendelsohn | H04B 7/18515 |
| 2021/0336334 A1 * | 10/2021 | Blanchette | H01Q 1/288 |

FOREIGN PATENT DOCUMENTS

| | | |
|---|---|---|
| JP | 2004281966 | 10/2004 |
| JP | 2008193701 | 2/2010 |
| JP | 2014078004 | 5/2014 |

OTHER PUBLICATIONS

Y. Zhihua et al., "A New Design of WDM-Based Optical Inter-satellites Links in Modern Smail Satellite Constellations", Proceedings of SPIE, vol. 7279, 2008, 6 pages, US.

M. Wener et al., "Capacity Dimensioning of Intersatellite Links in Constellation Networks USing Optical WDM Networking", American institute of Aeronautics and Astronauts, 2002, 5 pages, US.

K. Sumathi et al., "Design of 3.84 Tbps WDM-PDM based intersatellite optical wireless communication (IsOWC) system using spectral efficient orthogonal modulation scheme", Journal of Ambient Intelligence and Humanized Computing, vol. 11, 2020, abstract only, US.

Al-Selwi et al., "Performance Analysis of Optical Wireless inter Satellite Links by Using WDM and Co-OFDM Techniques", International Journal for Research in Applied Science & Engineering Technology, vol. 5(6), 2017, pp. 678-63, US.

M. Singh et al., "Simulative Analysis of Inter-Satellite Optical Wireless Communication (IsOWC) Link with EDFA", Journal of Optical Communications, 2018, abstract only, US.

M. Natera et al., "New Antenna Array Architectures for Satellite Communications", Advances in Satellite Communications, 2011, pp. 167-194, US.

B. Wu et al., "A Multiband Transparent Transponder Based on Reconfigurable Optical Frequency Combs for Cross Connection of Intersatellite and Satellite Ground", IEEE Photonics Journal, vol. 10(5), 2018, US.

I. Aldaya et al., "A Tutorial on Optical Feeding of Millimeter-Wave Phased Array Anttenas for Communication Applications", International Journal of Antennas and Propogation, vol. 2015, 22 pages, US.

R. Chen et al., "Polymer-Based Photonic Phased-array Antenna System based on Detector-switched optical Blass Matrix True-time Delay Steering", University of Texas at Austin, 13 pages, US.

H. Aliakbarian et al., "Analogue versus Digital for Baseband Beam Steerable Array used for LEO Satellite Applications", Conference paper, IEEE Xplore, 2010, 4 pages, BE.

E. Gawton, "Electro-optic antenna elements for passive phased array radar", Master's thesis, Michigan Technological University, 2019, 64 pages, US.

B. Quiang Xu, "Electrically Controlled Optical Polarization Rotation on a Silicon Chip Using Berry's Phase", Master's thesis, Ohio State University, 2015, 37 pages, US.

N. Karafolas, "Photonics in Telecom Satellite Payloads", European Space Research and Technology Centre, 103 pages, NL.

S. Das, "Silicon photonics based MEMS tunable polarization rotator for optical communications", Degree project, KTF Royal Intitule of Technology School of Electrical Engineering, 2016, 79 pages, SE.

A. Samani et al., "Experimental parametric study of 128 Gb/s PAM-4 transmission system using a multi-electrode silicon photonic Mach Zehnder modulator", Optics Express, vol. 25(12), 2017, 11 pages, US.

B. Gao et al., "High-resolution phased array radar imaging by photonics-based broadband digital beamforming", Optics Express, vol. 27(9), 2019, 10 pages, US.

D. Vermeulen et al., "High Efficiency Broadband Polarization Rotator on Silicon-On-Insulator", Research paper, Ghent University, 3 pages, DE.

V. Duarte et al., "Modular coherent photonic-aided payload receiver for communications satellites", Nature Communcations, 9 pages, US.

W. Sacher et al., "Polarization rotator-splitters in standard active silicon photonics platforms", Optical Society of America, 2014, 10 pages, US.

Bandwidth 10, Ltd. "TO-56 7 Pin TOSA Package", Application notes, 2019, 10 pages, US.

Bandwidth 10, Ltd. "C-Band Tunable 1550 nm Single Mode Optical Transceivers", Product specification, 2019, 12 pages, US.

Bandwidth 10, Ltd. "1550 nm Tunable VCSEL in TOSA Package with TEC", Product specification, 2019, 3 pages, US.

A. Gerke, "Optomechanical Dynamics in Vertical-Cavity Surface-Emitting Lasers", Technical report, Electrical University of California at Berkeley, 2017, 103 pages, US.

D. Melati et al., "Compact and Low Crosstalk Echelle Grating Demultiplexer on Silicon-On-Insulator Technology", Electronics, vol. 8, 2019, 7 pages, US.

H. Sahoo et al., "Wavelength tunable MEMS VCSELs for OCT Imaging", Proceedings of SPIE, vol. 10552, 2018, US.

H. Sahoo et al., "Tunable MEMS VCSEL on Silicon substrate", Journal of Latex Class Files, 2019, 7 pages, US.

Xenesis, "High-Throughput Optical Communications Space Terminal", NASA Technology Transfer Program, 2 pages, US.

S. Pradham et al., "Inter-satellite Optical Wireless Communication System Design Using Diversity Techniques", International Conference on Microwave, Optical and Communication Engineering, 2015, 4 pages, IN.

J. Padhy et al., "100 Gbps multiplexed Inter-satellite optical wireless communication system", Optical and Quantum Electronics, 2019, 16 pages, US.

Tanskanen, A et al., "Radiation Tolerant 6.25 Gbps 850nm Optical Transceiver", 17th European Conference on Radiation and Its Effects on Components and Systems (RADECS), 2017.

Cruz Colon, J., et al., Radiation Evaluation of the Texas Instruments TPS7H2201-SP eFuse, IEEE Radiation Effects Data Workshop, 2019.

Kirby, K., et al., "Radiation Belt Storm Probes—Observatory and Environments", The Van Allen Probes Mission, 2012.

\* cited by examiner

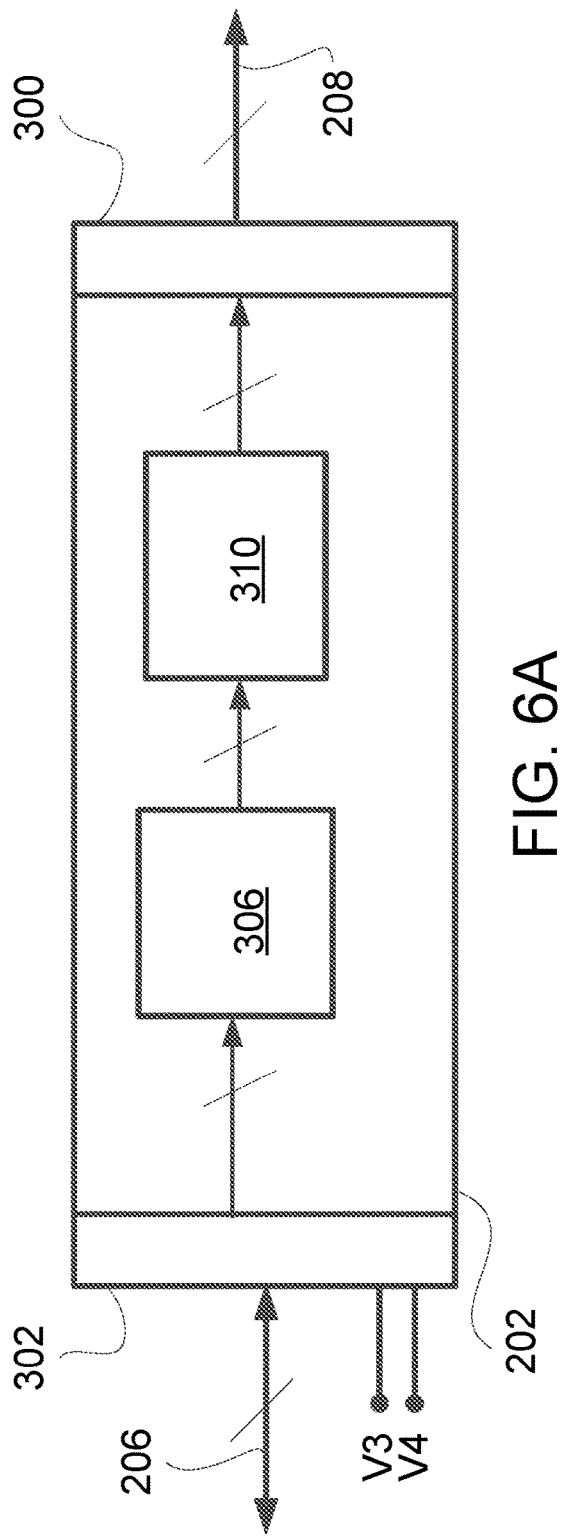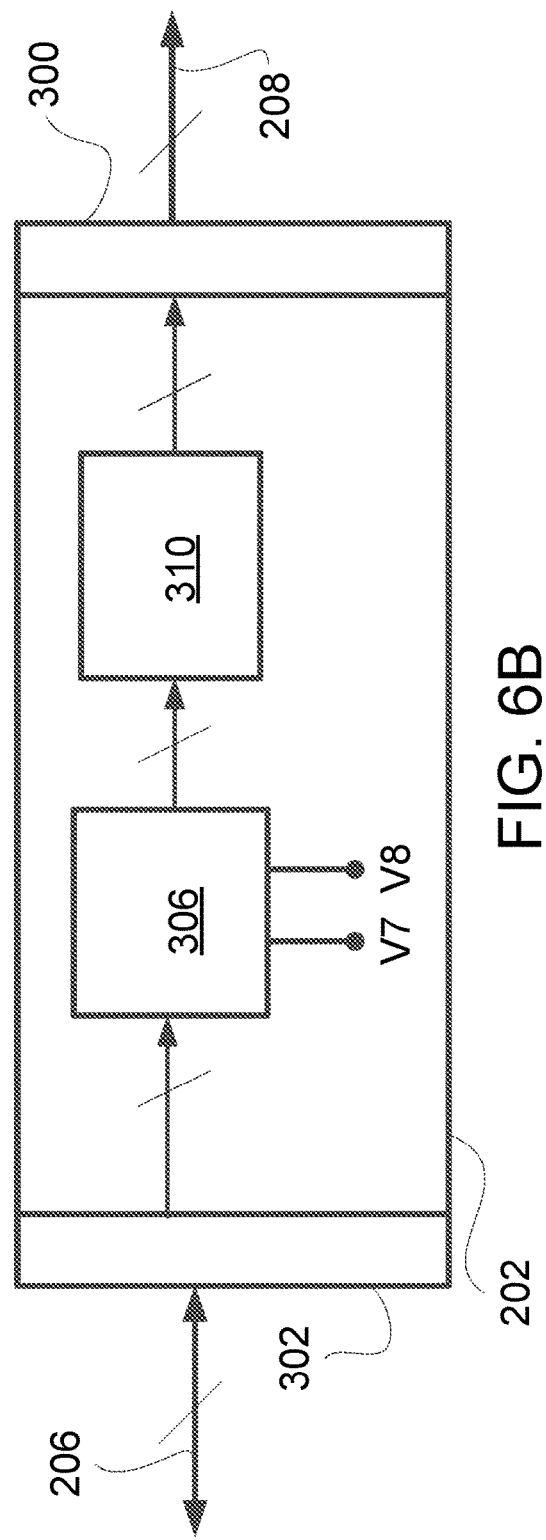

RADIATION TOLERANT ELECTRO-OPTICAL DEVICES FOR COMMUNICATION IN SPACE

CROSS-REFERENCE TO RELATED APPLICATIONS

The present application claims the benefit to U.S. Provisional Patent Application No. 63/015,105 filed on Apr. 24, 2020, the contents of which are hereby incorporated by reference in their entirety.

TECHNICAL FIELD

The present disclosure relates generally to electro-optical devices and more particularly, to methods and systems for providing radiation tolerance for electro-optical devices used for spacecraft communication.

BACKGROUND OF THE ART

With the wide availability and use of satellites in so many fields, there is a growing need for more operational flexibility for satellite operators. As the technology and architecture of communication payloads of satellites moves towards digital payloads, digital optical interconnect devices like parallel electro-optical modules are vulnerable to issues such as signal integrity, degradation, and functional interruptions when exposed to radiation. Therefore, improvements are needed.

SUMMARY

In accordance with a broad aspect, there is provided an electro-optical device for intra-spacecraft communication in space, the electro-optical device having at least one of transmitting capabilities for converting a first electrical signal into a first optical signal and outputting the first optical signal within a spacecraft, and receiving capabilities for receiving a second optical signal within the spacecraft and converting the second optical signal into a second electrical signal, the electro-optical device having at least one integrated circuit dedicated to at least one of the transmitting capabilities and the receiving capabilities, the at least one integrated circuit configured for operating in an analog mode where configuration voltages for the integrated circuit are provided by analog voltage settings unaffected by radiation.

In accordance with another broad aspect, there is provided a method for operating an electro-optical device for intra-spacecraft communication. The method comprises configuring integrated circuits in the electro-optical device dedicated to at least one of transmitting and receiving capabilities with analog voltage settings unaffected by radiation; driving the electro-optical device from an electrical circuit; and operating the integrated circuits in analog mode while performing at least one of: converting a first electrical signal into a first optical signal and outputting the first optical signal within the spacecraft; and receiving a second optical signal within the spacecraft and converting the second optical signal into a second electrical signal.

Features described herein may be used in various combinations, in accordance with the embodiments described herein.

BRIEF DESCRIPTION OF THE DRAWINGS

Reference is now made to the accompanying figures in which:

FIG. 6A-6B are block diagrams of an example electro-optical device from the board of FIG. 2 having only transmitting capabilities.

It will be noted that throughout the appended drawings, like features are identified by like reference numerals.

DETAILED DESCRIPTION

Figure 1:
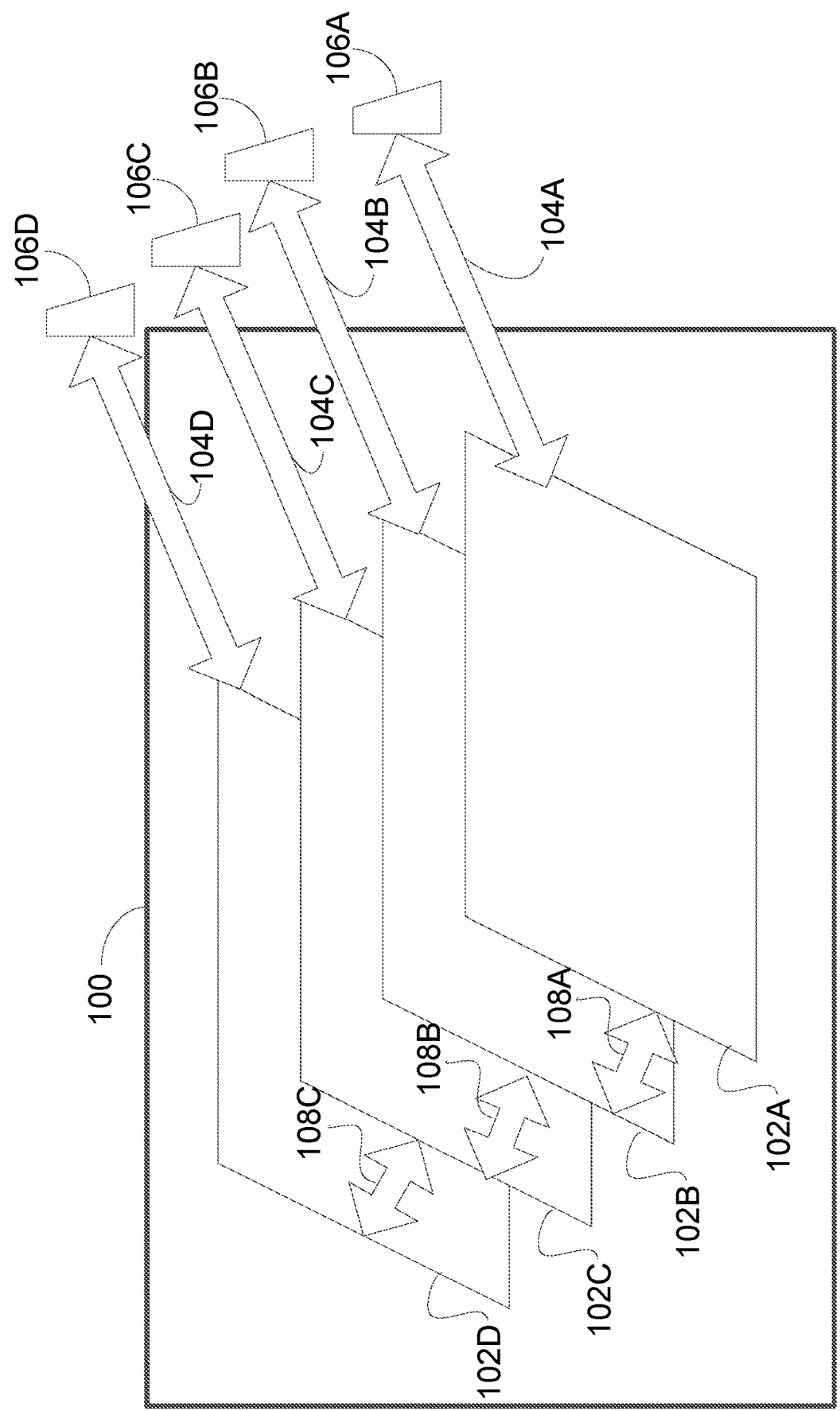
FIG. 1 is a block diagrams of an example spacecraft.

FIG. 1 illustrates an example spacecraft 100. The spacecraft 100 may be a satellite or any other vehicle or machine designed to fly in outer space. In some embodiments, the spacecraft 100 is a high throughput satellite (HTS). In some embodiments, the spacecraft 100 is a high throughput geostationary communications satellite. For example, the spacecraft 100 may be a multi-beam satellite having a large number of $K_a$ band (30 GHz to 40 GHz) or Ku-band (12 GHz to 18 GHz) spot-beams. Other embodiments may also apply.

The spacecraft 100 comprises a plurality of boards 102A-102D, which are stacked to form a digital payload. Although four boards are illustrated, more or less than four may be provided. The boards 102A-102D are coupled to corresponding antennae 106A-106D through optical interconnects 104A-104D, respectively. The optical interconnects 104A-104D correspond to any system capable of transmitting light and may be composed of one or more optical component, such as optical waveguides, optical fibers, lenses, mirrors, optical actuators, optical sensors, and the like. The antennae 106A-106D are configured for emitting satellite signals, such as spot beams.

The boards 102A-102D are coupled together via optical interconnects 108A-108C, which may differ from optical interconnects 104A-104D. The example of FIG. 1 illustrates board 102A optically connected to board 102B, and board 102B optically connected to board 102C. Additional optical interconnections may be provided, such as between board 102A and board 102C. The optical interconnects 108A-1080 transfer data between the boards 102A-102D, which may be data as received from multiple beams.

Figure 2:
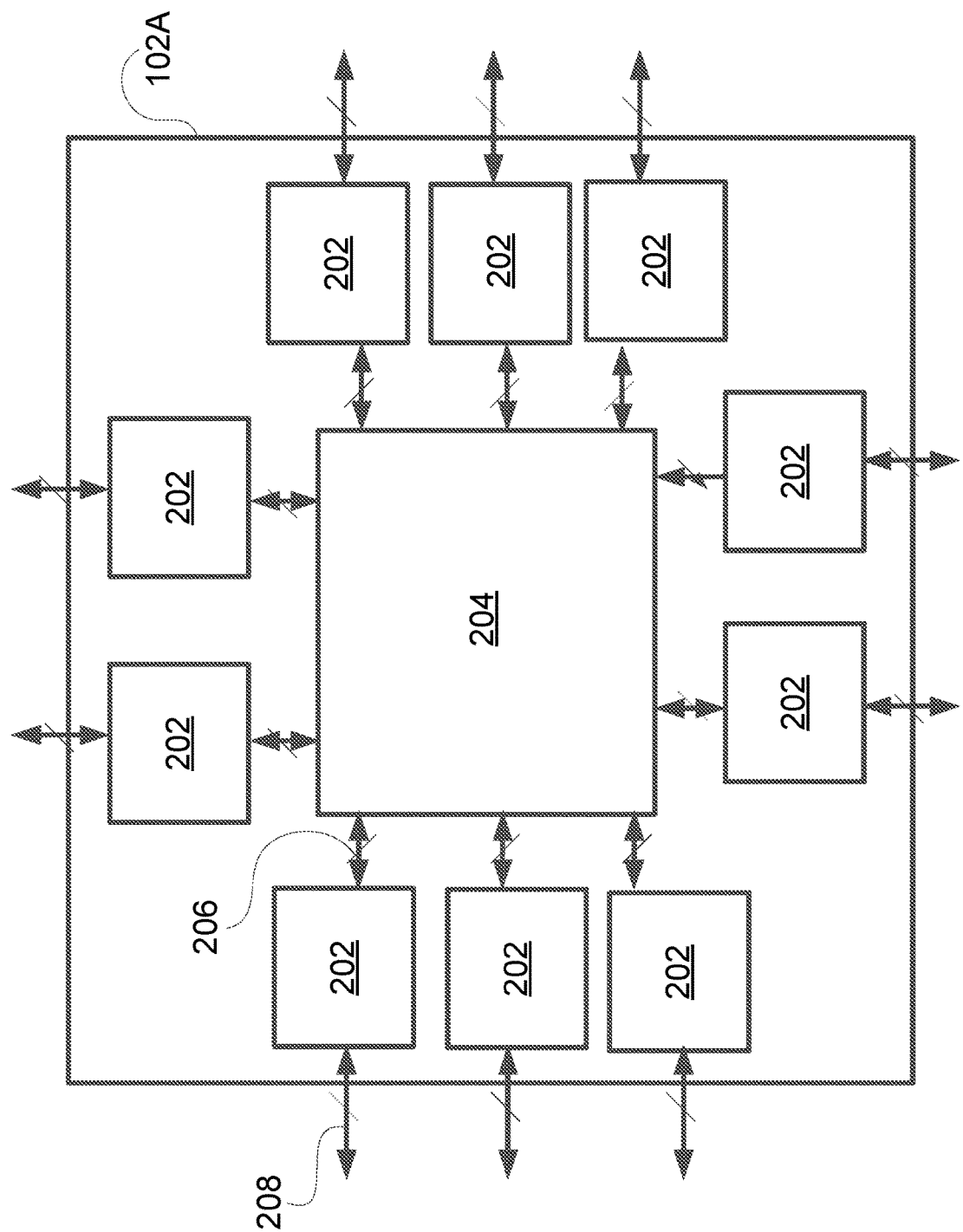
FIG. 2 is a block diagram of an example board from the spacecraft of FIG. 1.

Referring to FIG. 2, there is illustrated an example embodiment of a board 102A. A plurality of electro-optical devices 202 are located on the board 102A and coupled to an electrical circuit 204. The electro-optical devices 202 have transmitting and/or receiving capabilities, such that they may be electro-optical transmitters, electro-optical receivers, or electro-optical transceivers. Any number of electro-optical devices 202 may be provided on a given board 102A.

Optical signals 208 are received at the electro-optical devices 202 and/transmitted from the electro-optical devices 202.

The electrical circuit 204 may be used to drive optical emitter(s) in the electro-optical devices 202 and/or process/condition data signals received by photodetector(s) in the electro-optical devices 202, depending on the capabilities of the electro-optical devices 202. In some embodiments, the electrical circuit 204 is a passive or active switching device. The electrical circuit 204 may be connected to the electro-optical devices 202 with, for example, parallel high-speed electrical lanes for transmitting electrical signals 206. Other embodiments may also apply, depending on practical implementations.

Figure 3:
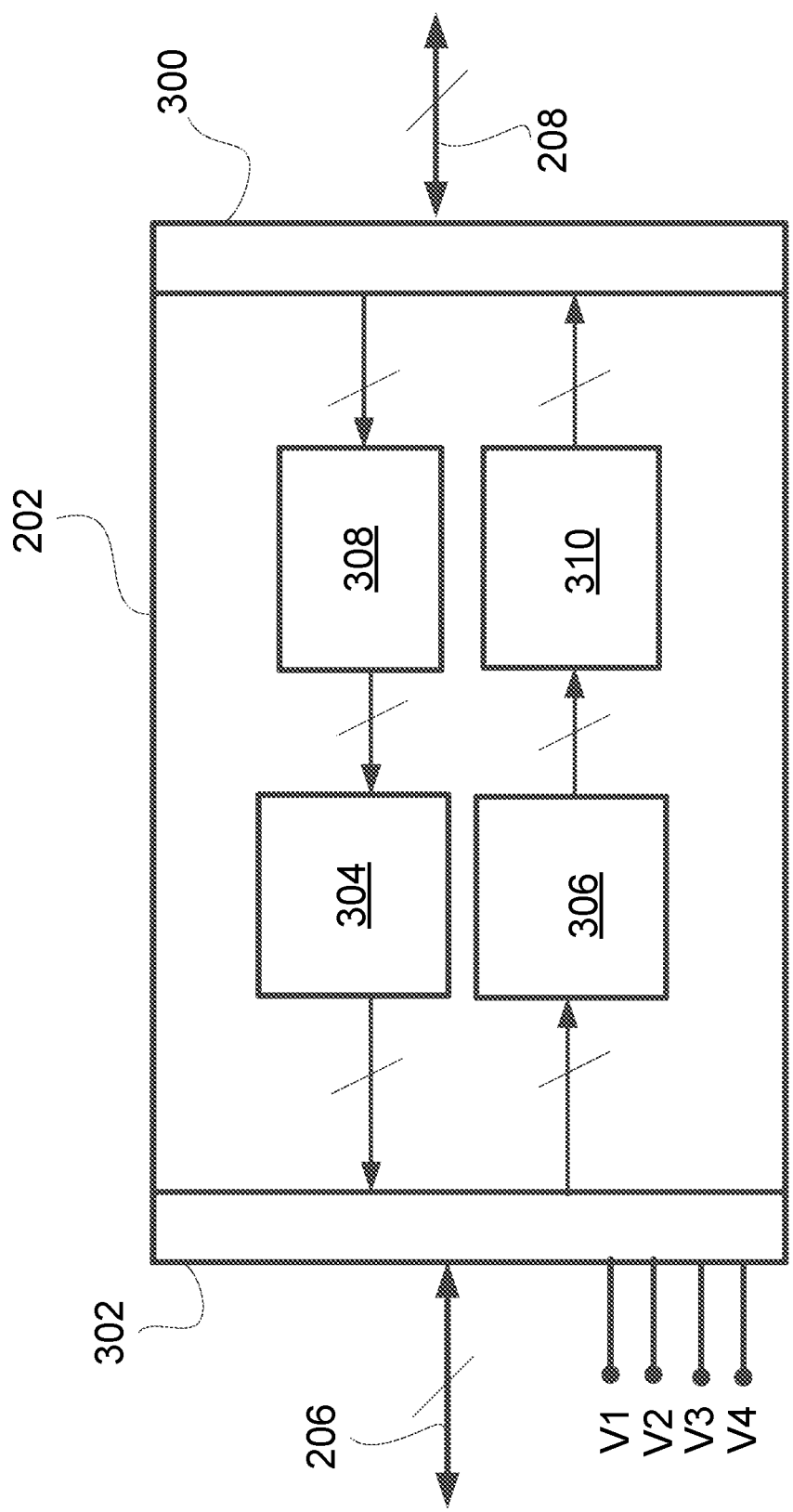
FIG. 3 is a block diagram of an example electro-optical device from the board of FIG. 2, with external connections for analog settings.

Referring to FIG. 3, there is illustrated an example embodiment of one of the electro-optical devices 202 with transceiver capabilities. An incoming optical signal 208 is received at an optical interface 300 and input to a photodetector 308 for converting the incoming optical signal 208 into an electrical signal. Although only one photodetector 308 is illustrated, there may be a plurality of photodetectors 308 in the electro-optical devices 202. The electrical signal travels to an amplifier, such as a transimpedance amplifier (TIA) integrated circuit 304, for conversion to a proportional output voltage and/or current which is sent to an electrical interface 302. The electro-optical devices 202 may be coupled to the electrical circuit 204 through the electrical interface 302, such that the proportional output voltage and/or current is transformed into high speed differential signals 206 that are sent to the electrical circuit 204.

The optical interface 300 may comprise one or more optical component for propagating and/or capturing the optical signal 208. More specifically, an optical signal is received from an optical fiber, with the light being guided in the core of the fiber. The fiber may be a single mode fiber or a multimode fiber. The optical interface 300 may comprise a set of beam treatment optics, such as a lens or lens system. The lens may also be replaced by one or more curved mirror. Any component capable of changing the geometrical characteristics of a light beam, such as changing the beam size or beam orientation may be used. A single set of beam treatment optics may be used.

An incoming electrical signal 206 is received, for example from the electrical circuit 204, at the electrical interface 302 and transmitted to a light emitting driver integrated circuit 306. The light emitting driver integrated circuit 306 converts differential high speed signals from the electrical circuit 204 in order to provide current to an optical emitter 310 for generating an optical signal, which is then output from the electro-optical devices 202 through the optical interface 300. Although a single optical emitter 310 is illustrated, there may be a plurality of optical emitters 310 in the electro-optical devices 202. The optical emitter 310 may take many forms, such as but not limited to a directly modulated side emitting laser, a light emitting diode (LED), a distributed feedback bragg (DFB) side emitter, a vertical-cavity surface-emitting laser (VCSEL), a wavelength tunable VCSEL, a single mode laser operated in a constant power mode, and the like.

The electro-optical devices 202 are configured to operate in an analog mode in order to improve their immunity to radiation. More particularly, the chips used for the integrated circuits found in the electro-optical devices 202, such as the TIA 304 and/or the light emitting driver 306, may be analog, or analog and digital, but are configured for operation with analog voltages as settings. In some embodiments, the voltage configurations for the circuits are provided by wired values and not connected to any registers or memory, or any other entity that can have its logic state affected by radiation. In other words, the configuration voltages are permanently connected and cannot be altered by software. It will be understood that other chip functions may be provided in the electro-optical devices 202, such as temperature measurement or current monitoring. In some embodiments, the chips used for the integrated circuits found in the electro-optical devices 202 are complex chipsets with a digital backend and an analog front end.

In some embodiments, the integrated circuits 304, 306 are set with analog voltages through external connections V1-V4, as illustrated in FIG. 3. Connections V1, V2 are associated with the integrated circuit 304 and may be set to (V+, Ground); (V+, V+); (Ground, Ground); and (Ground, V+), respectively, depending on the desired configuration. Connections V3, V4 are associated with the integrated circuit 306 and may be set to (V+, Ground); (V+, V+); (Ground, Ground); and (Ground, V+), respectively, depending on the desired configuration. It will be understood that V1-V4 can be set to any voltage level.

Figure 4:
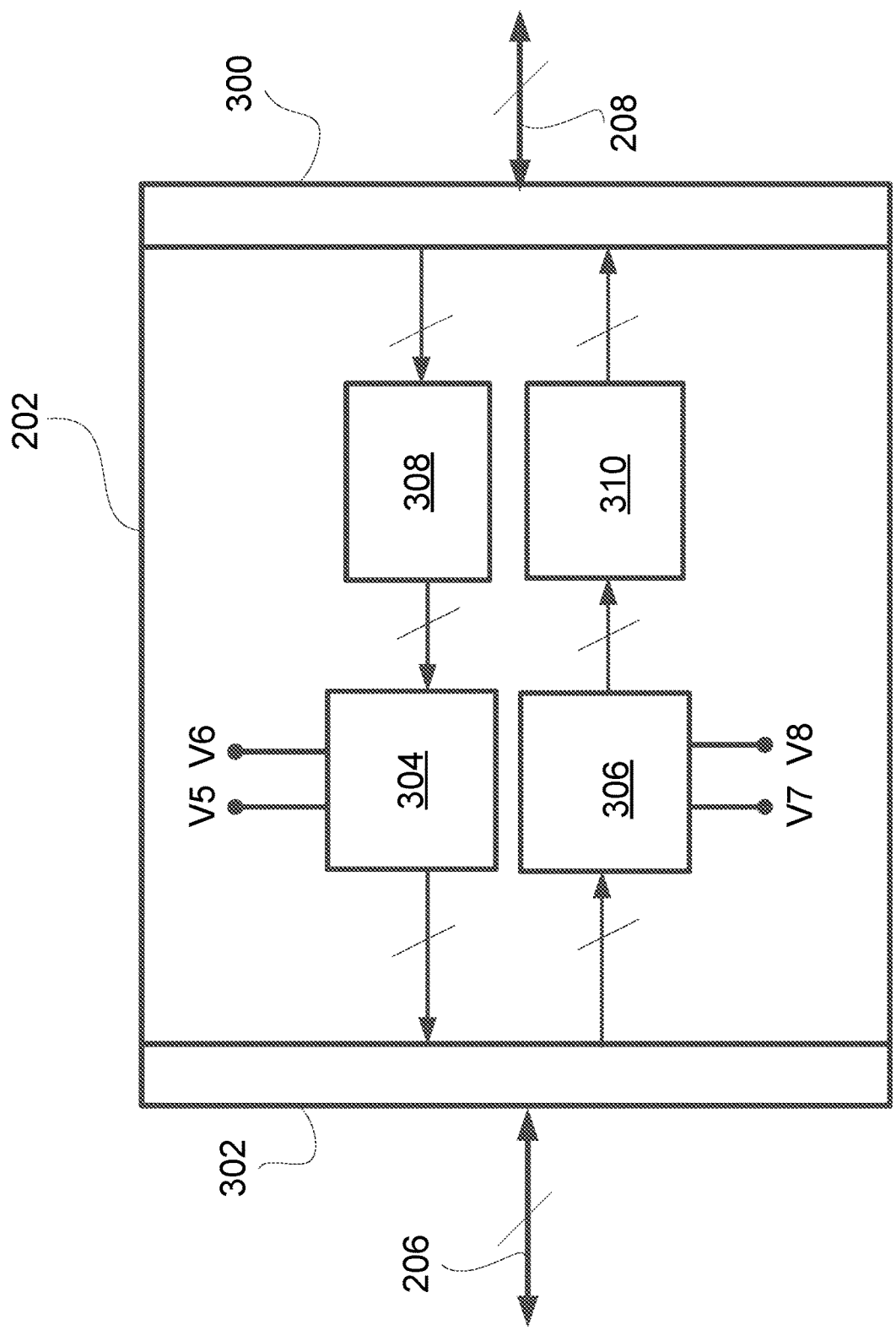
FIG. 4 is a block diagram of an example electro-optical device from the board of FIG. 2, with internal connections for analog settings.

In some embodiments, the electro-optical devices 202 are configured with analog voltages through internal connections V5-V8, as illustrated in FIG. 4. Similarly to the embodiment shown in FIG. 3, the internal connections V5, V6 are associated with the integrated circuit 304 and may be set to (V+, Ground); (V+, V+); (Ground, Ground); and (Ground, V+), respectively, depending on the desired configuration. Connections V7, V8 are associated with the integrated circuit 306 and may be set to (V+, Ground); (V+, V+); (Ground, Ground); and (Ground, V+), respectively, depending on the desired configuration. It will be understood that V5-V8 can be set to any voltage level.

In some embodiments, one of the integrated circuits, for example TIA 304, is provided with external connections V1, V2, and another of the integrated circuits, for example light-emitting driver 306, is provided with internal connections V5, V6. In some embodiments, external connections V1-V4 remain unconnected and voltage levels are set internally to the electro-optical devices 202 by pull-up or pull-down resistors.

In some embodiments, the chips themselves, forming the integrated circuits 304, 306, are provided with an intrinsic configuration for V5, V6 and/or V7, V8 voltages, for example through a physical layer in the chip, so as to provide the analog voltages. There are no connections outside of the integrated circuits 304 and/or 306, and no connections outside of the electro-optical devices 202. Any combination of external connections, internal connections, and intrinsic configurations may be used with the integrated circuits 304, 306 of the electro-optical devices 202. It will be understood that more than four analog voltages may be used for the electro-optical devices 202, depending on practical implementations.

External and/or internal connections may be hardwired. In some embodiments, hardwired settings may be configured through the use of one or more eFuse, where settings are configured by "blowing" an eFuse.

Figure 5A:
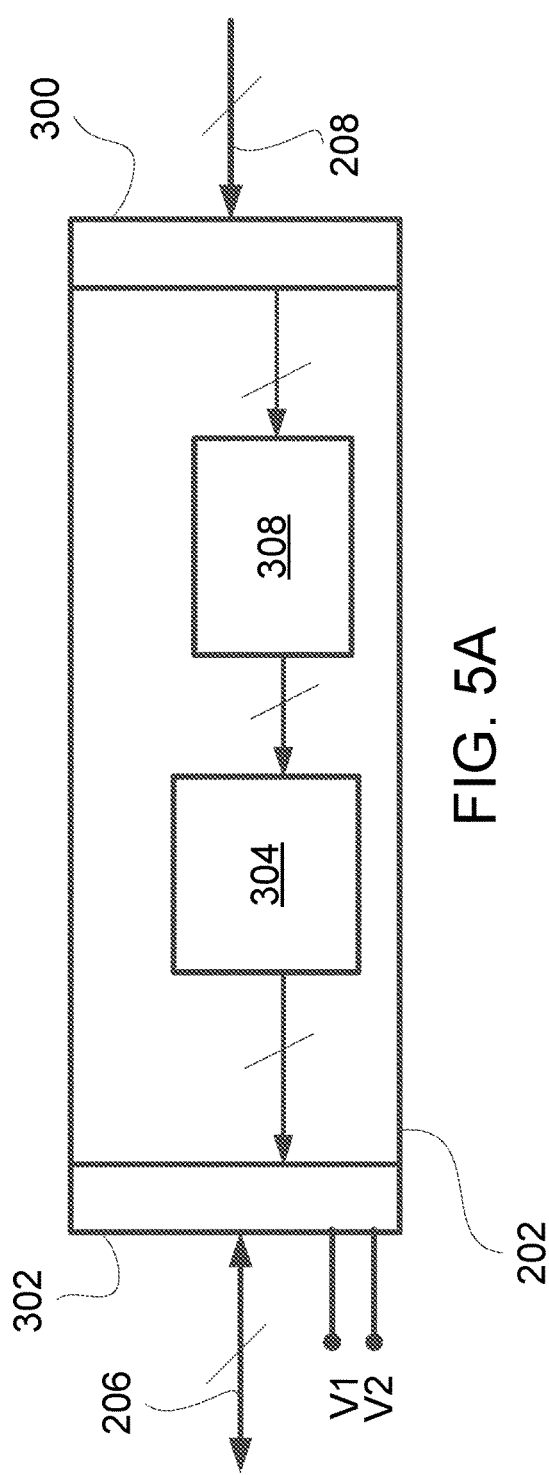
FIGS. 5A-5B are block diagrams of an example electro-optical device from the board of FIG. 2 having only receiving capabilities.
Figure 5B:
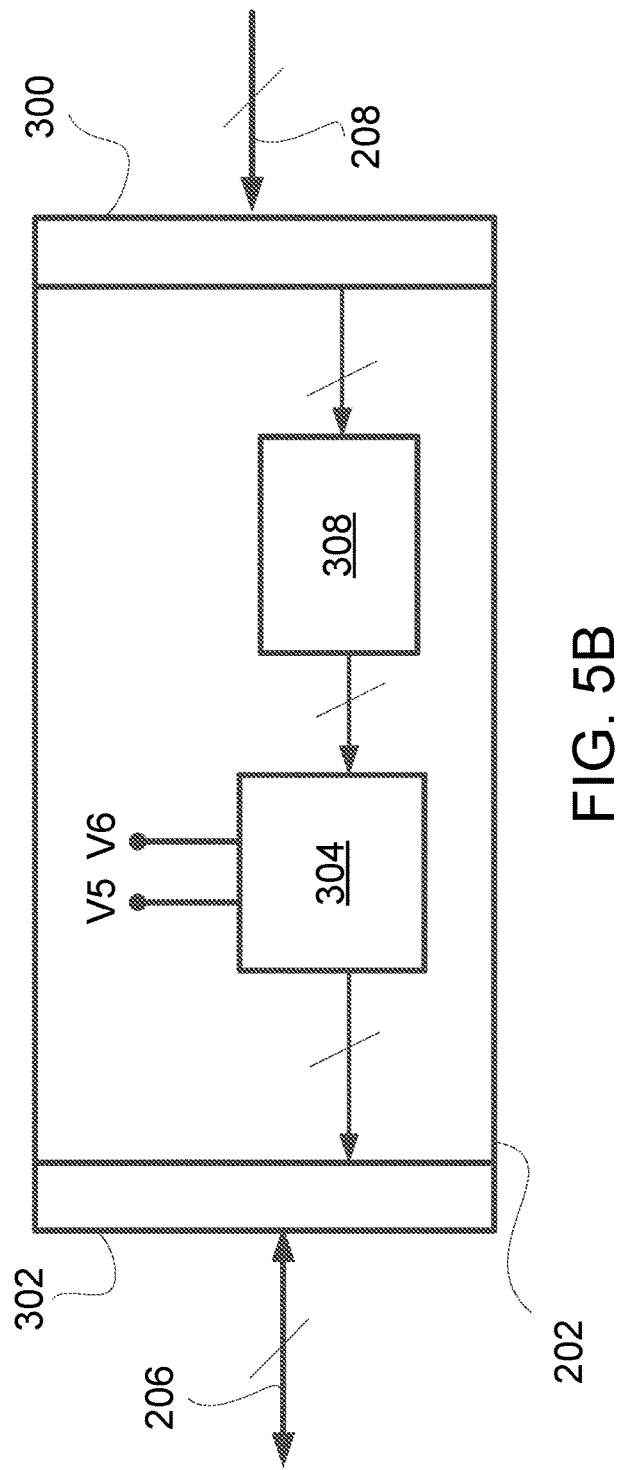

The embodiments described with respect to FIGS. 3 and 4 are also applicable for electro-optical devices having only transmitting or only receiving capabilities. Examples for one of the electro-optical devices 202 having only receiving capabilities are illustrated in FIGS. 5A, 5B. Examples for one of the electro-optical devices 202 having only transmitting capabilities are illustrated in FIGS. 6A, 6B.

More generally, there is disclosed herein electro-optical devices for communication in space, the electro-optical devices having at least one of transmitting capabilities for generating an optical signal and outputting the optical signal, and receiving capabilities for receiving an optical signal and converting the optical signal into an electrical signal, the electro-optical devices having at least one integrated circuit dedicated to at least one of the transmitting capabilities and the receiving capabilities, the integrated circuit configured for operating in an analog mode by having analog voltages as settings.

Figure 7:
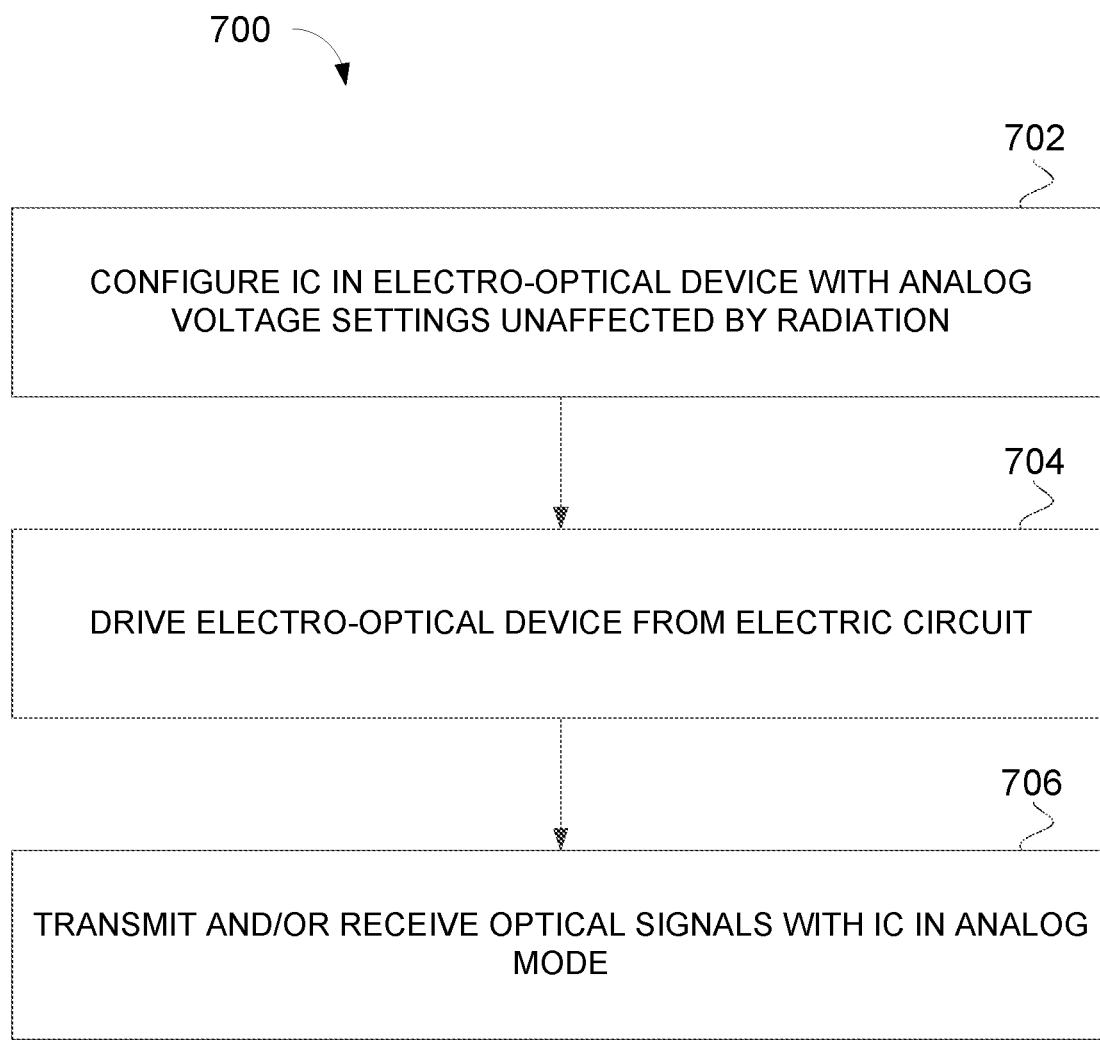
FIG. 7 is a flowchart of an example method for operating an electro-optical device for space communication.

With reference to FIG. 7, there is illustrated a flowchart of a method 700 for operating an electro-optical device for communication in space. At step 702, the integrated circuits in the electro-optical device dedicated to transmitting and/or receiving are configured with analog voltage settings unaffected by radiation. As stated above, this may mean providing the analog voltage settings through connections that extend outside of the electro-optical device, providing the analog voltage settings through connections inside the electro-optical device, providing the analog voltage settings intrinsically to the integrated circuits, providing the analog voltage settings through hardwired connections, or reconfiguring the analog voltage settings (i.e. through eFuse).

At step 704, the electro-optical device is driven by an electrical circuit. It will be understood that steps 702 and 704 may be performed in any order, or concurrently. At step 706, the integrated circuits are operated in analog mode for transmitting and/or receiving optical signals. The integrated circuits may also be operable in a digital mode, but they are operated in the analog mode during the transmission/reception in order to protect the electro-optical device from radiation, which in some embodiments is a transceiver. The transceiver may form part of a high throughput satellite or another type of spacecraft.

The improved radiation immunity of the electro-optical devices with integrated circuits operating in analog mode was demonstrated through Single Event Effect (SEE) heavy ion radiation tests on 28 G transceivers. The 28 G transceivers were exposed to heavy ion beams with a Linear Energy Transfer (LET) of varying magnitude. The objective of the tests was to determine at which energy level the transceivers started to exhibit a single event functional interrupt (SEFI). All tests were performed in accordance with the ESCC 25100 Issue 2: Single Event Effect Test Method and Guidelines. It will be understood by those skilled in the art that the bit rate of the tested transceivers had no impact on the outcome of the test. In other words, 10 Gbps and 1 Gbps transceivers demonstrated the same behaviour with respect to radiation tolerance.

A first series of tests was performed on three different chipsets, from three different manufacturers (Chipset_A; Chipset_B; Chipset_C). All three chipsets were connected so as to operate in digital mode.

The results of the first series of tests are shown in Table 1.

TABLE 1

| CHIPSET | LET TESTED (MeVcm$^2$/mg) | OPERATING MODE | RESULT |
| --- | --- | --- | --- |
| Chipset_A | Ne (2.6) | Digital mode | Reset after 3 sec (fluence of 1.98 × 10$^5$) |
| Chipset_A | N (1.3) | Digital mode | No reset (fluence of 1 × 10$^7$) |
| Chipset_A | H (0.11) | Digital mode | No reset (fluence of 1 × 10$^7$) |
| Chipset_A | Ag (40.3) | Digital mode | Reset after 2 sec (fluence of 1.35 × 10$^5$) |

TABLE 1-continued

| CHIPSET | LET TESTED (MeVcm$^2$/mg) | OPERATING MODE | RESULT |
| --- | --- | --- | --- |
| Chipset_B | Ne (2.6) | Digital mode | Reset after 37 sec (fluence of 2.4 × 10$^6$) |
| Chipset_B | N (1.3) | Digital mode | No reset (fluence of 1 × 10$^7$) |
| Chipset_B | Ag (40.3) | Digital mode | Reset after 3 sec (fluence of 1.98 × 10$^5$) |
| Chipset_C | Ne (2.6) | Digital mode | Reset after 31 sec |
| Chipset_C | N (1.3) | Digital mode | No reset (fluence of 1 × 10$^7$) |
| Chipset_C | Ag (40.3) | Digital mode | Reset after 12 sec |

The results of the first series of tests show that for all three chipsets, there were SEFI exhibited when the LET went above 2.6 MeV cm$^2$/mg. Chipset_A and Chipset_B were shown to be sensitive to the heavy ion radiation and the reset happened very quickly, even with the low energy ions. Chipset_C failed the heavy ion radiation test but the reset occurred later than with Chipset_A and Chipset_B.

Additional verifications were performed to confirm that the resets were not due to the test setup, such as testing the chipsets with lid covers on and with lowest energy ions. All chipsets passed the radiation test under these conditions.

A second series of tests was performed on Chipset_C with recovering of the chipsets after a reset by scrubbing (i.e. overwriting) the registers or turning the power supply off and on. The chipsets for the second series of tests were connected in digital mode and in analog mode.

The results of the second series of tests are shown in Table 2.

TABLE 2

| CHIPSET | LET TESTED (MeVcm$^2$/mg) | OPERATING MODE | RESULT |
| --- | --- | --- | --- |
| Chipset_C | Ne (2.6) | Digital mode | No scrubbing; no reset (fluence of 1 × 10$^7$) |
| Chipset_C | Ne (2.6) | Analog mode | No reset (fluence of 1 × 10$^7$) |
| Chipset_C | Ar (8.0) | Digital mode | No scrubbing; 3 resets (fluence of 1 × 10$^7$) |
| Chipset_C | Ar (8.0) | Digital mode | Scrubbing (0.5 sec); 2 resets (fluence of 1 × 10$^7$) |
| Chipset_A | Ar (8.0) | Analog mode | No reset (fluence of 1 × 10$^7$) |

The results of the second series of tests show that Chipset_C passed the radiation test without any reset when operating in analog mode, for Ne and Ar. While no resets occurred (with and without scrubbing) for Ne while in digital mode, multiple resets took place for Ar (with and without scrubbing).

A third series of tests was performed on Chipset_C. the chipset was connected in analog mode and in digital mode. The tests were applied specifically to 12 transmitter channels and 12 receiver channels.

The results of the third series of tests are shown in Table 3.

TABLE 3

| CHIPSET | LET TESTED (MeVcm$^2$/mg) | OPERATING MODE | RESULT |
|---|---|---|---|
| Chipset_C | Ne (2.6) | Analog mode | No reset (fluence of 1 × 10$^7$) |
| Chipset_C | Ar (8.0) | Analog mode | No reset (fluence of 1 × 10$^7$) |
| Chipset_C | Cu (18.7) | Analog mode | No reset (fluence of 1 × 10$^7$) |
| Chipset_C | Pr (56) | Analog mode | No reset (fluence of 1 × 10$^7$) |
| Chipset_C | Ho (66.7) | Analog mode | No reset (fluence of 1 × 10$^7$) |
| Chipset_C 12Ch Rx | Ne (2.6) | Analog mode | No reset (fluence of 1 × 10$^7$) |
| Chipset_C 12Ch Rx | Ar (8.0) | Analog mode | No reset (fluence of 1 × 10$^7$) |
| Chipset_C 12Ch Rx | Cu (18.7) | Analog mode | No reset (fluence of 1 × 10$^7$) |
| Chipset_C 12Ch Rx | Pr (56) | Analog mode | No reset (fluence of 1 × 10$^7$) |
| Chipset_C 12Ch Rx | Ho (66.7) | Analog mode | No reset (fluence of 1 × 10$^7$) |
| Chipset_C 12Ch Rx | Ne (2.6) | Digital mode | No reset (fluence of 1 × 10$^7$) |
| Chipset_C 12Ch Rx | Ar (8.0) | Digital mode | 2 resets (fluence of 1 × 10$^7$) |
| Chipset_C 12Ch Rx | Cu (18.7) | Digital mode | Scrubbing (0.25 s) 2 resets (fluence of 1 × 10$^7$) |
| Chipset_C 12Ch Tx | Ne (2.6) | Analog mode | No reset (fluence of 1 × 10$^7$) |
| Chipset_C 12Ch Tx | Ar (8.0) | Analog mode | No reset (fluence of 1 × 10$^7$) |
| Chipset_C 12Ch Tx | Cu (18.7) | Analog mode | No reset (fluence of 1 × 10$^7$) |
| Chipset_C 12Ch Tx | Pr (56) | Analog mode | No reset (fluence of 1 × 10$^7$) |
| Chipset_C 12Ch Tx | Ho (66.7) | Analog mode | No reset (fluence of 1 × 10$^7$) |
| Chipset_C 12Ch Tx | Ne (2.6) | Digital mode | No reset (fluence of 1 × 10$^7$) |
| Chipset_C 12Ch Tx | Ar (8.0) | Digital mode | 3 resets (fluence of 1 × 10$^7$) |

The results of the third series of tests show that Chipset_C passed the heavy ion radiation tests without any resets when in analog mode. This confirms that the microelectronic and optoelectronic components of the chipset are not affected by charged particles and cosmic rays, as is required for a component to be deemed stable and reliable for space operation.

It will be understood that operating the electro-optical devices with integrated circuits in analog mode, as described herein, provides advantages over operating said electro-optical devices in digital mode, even with mitigating solutions to reduce the sensitivity of the integrated circuits to radiation. Some example mitigating solutions are to perform scrubbing on a regular basis and/or to have additional redundancy built-in to the circuits. In some cases, a certain level of SEFI are simply accepted and the system is reset on a regular basis to rid the device of any accumulated radiation. However, such systems need to be capable of supporting such solutions, whether it be scrubbing, resets, more redundancy, or any other means used to reduce the sensitivity to radiation. There may be additional physical requirements, such as the need for more communication ports, in order to support such solutions. Furthermore, such solutions may simply not be feasible for electro-optical devices deployed in space, as the accessibility is reduced and the reliability threshold is increased versus other non-space environments. As an example, the European Space Agency and NASA generally require components used in space to be immune to radiation for up to 60 MeV cm$^2$/mg, with a total fluence of about 1×10$^7$. The present disclosure demonstrates that the electro-optical devices as described herein meet these standards. In another noted advantage, there is no need to build custom chips in order to meet the high standards for radiation immunity. Although custom chips may also be used, standard chipsets with parameter settings as described herein may also be suitable.

The above description is meant to be exemplary only, and one skilled in the art will recognize that changes may be made to the embodiments described without departing from the scope of the invention disclosed. Still other modifications which fall within the scope of the present invention will be apparent to those skilled in the art, in light of a review of this disclosure.

Various aspects of the systems and methods described herein may be used alone, in combination, or in a variety of arrangements not specifically discussed in the embodiments described in the foregoing and is therefore not limited in its application to the details and arrangement of components set forth in the foregoing description or illustrated in the drawings. For example, aspects described in one embodiment may be combined in any manner with aspects described in other embodiments. Although particular embodiments have been shown and described, it will be apparent to those skilled in the art that changes and modifications may be made without departing from this invention in its broader aspects. The scope of the following claims should not be limited by the embodiments set forth in the examples, but should be given the broadest reasonable interpretation consistent with the description as a whole.

The invention claimed is:

1. An electro-optical device for intra-spacecraft communication, the electro-optical device having at least one of transmitting capabilities for converting a first electrical signal into a first optical signal and outputting the first optical signal within a spacecraft, and receiving capabilities for receiving a second optical signal within the spacecraft and converting the second optical signal into a second electrical signal, the electro-optical device having at least one integrated circuit dedicated to at least one of the transmitting capabilities and the receiving capabilities, the at least one integrated circuit configured for operating in an analog mode where configuration voltages for the integrated circuit are provided by analog voltage settings unaffected by radiation.

2. The electro-optical device of claim 1, wherein the electro-optical device is a transceiver having the transmitting capabilities and the receiving capabilities.

3. The electro-optical device of claim 1, wherein the at least one integrated circuit is provided in a chip operable in the analog mode and in a digital mode.

4. The electro-optical device of claim 1, wherein the analog voltage settings are provided through connections that extend outside of the electro-optical device.

5. The electro-optical device of claim 1, wherein the analog voltage settings are provided through connections inside of the electro-optical device.

6. The electro-optical device of claim 1, wherein the analog voltage settings are reconfigurable with at least one eFuse.

7. The electro-optical device of claim 1, wherein the analog voltage settings are hardwired.

8. The electro-optical device of claim 7, wherein the analog voltage settings are provided intrinsically to the at least one integrated circuit.

9. The electro-optical device of claim 1, wherein the first and second optical signals are transmitted and received between boards of the spacecraft.

10. The electro-optical device of claim 1, wherein the first and second optical signals are transmitted and received between boards and antennae of the spacecraft.

11. The electro-optical device of claim 1, wherein the electro-optical device forms part of a high throughput satellite.

12. A method for operating an electro-optical device for intra-spacecraft communication, the method comprising:
- configuring integrated circuits in the electro-optical device dedicated to at least one of transmitting and receiving capabilities with analog voltage settings unaffected by radiation;
- driving the electro-optical device from an electrical circuit; and
- operating the integrated circuits in analog mode while performing at least one of:
  - converting a first electrical signal into a first optical signal and outputting the first optical signal within the spacecraft; and
  - receiving a second optical signal within the spacecraft and converting the second optical signal into a second electrical signal.

13. The method of claim 12, wherein configuring the integrated circuits in the electro-optical device comprises providing the analog voltage settings through connections that extend outside of the electro-optical device.

14. The method of claim 12, wherein configuring the integrated circuits in the electro-optical device comprises providing the analog voltage settings through connections inside the electro-optical device.

15. The method of claim 12, wherein configuring the integrated circuits in the electro-optical device comprises providing the analog voltage settings intrinsically to the integrated circuits.

16. The method of claim 12, wherein configuring the integrated circuits in the electro-optical device comprises providing the analog voltage settings through hardwired connections.

17. The method of claim 12, wherein configuring the integrated circuits in the electro-optical device comprises reconfiguring the analog voltage settings with at least one eFuse.

18. The method of claim 12, wherein the electro-optical device forms part of a high throughput satellite.

19. The method of claim 12, wherein the integrated circuits are operable in the analog mode and in a digital mode.

20. The method of claim 12, wherein the electro-optical device is a transceiver having the transmitting and receiving capabilities.

* * * * *